United States Patent [19]

Majd

[11] Patent Number: 5,155,904
[45] Date of Patent: Oct. 20, 1992

[54] REFLOW AND WAVE SOLDERING TECHNIQUES FOR BOTTOM SIDE COMPONENTS

[75] Inventor: Mohyeddin S. Majd, Spring, Tex.

[73] Assignee: Compaq Computer Corporation, Houston, Tex.

[21] Appl. No.: 679,780

[22] Filed: Apr. 3, 1991

[51] Int. Cl.[5] .............................................. H25K 3/30
[52] U.S. Cl. ........................................ 29/837; 29/890; 174/263; 228/180.1
[58] Field of Search ............... 29/840, 837; 228/180.1; 174/263

[56] References Cited

U.S. PATENT DOCUMENTS

| | | | |
|---|---|---|---|
| 4,208,005 | 6/1980 | Nate et al. | 29/840 X |
| 4,215,025 | 7/1980 | Packer et al. | 29/840 X |
| 4,506,443 | 3/1985 | Itoh | 29/840 |
| 4,515,304 | 5/1985 | Berger . | |
| 4,573,105 | 2/1986 | Beldavs . | |
| 4,761,881 | 8/1988 | Bora et al. . | |
| 4,814,944 | 3/1989 | Sagawa et al. . | |
| 4,851,966 | 7/1989 | Roback et al. . | |
| 4,908,936 | 3/1990 | Matsuura | 29/840 X |
| 4,982,376 | 1/1991 | Megens et al. | 29/840 X |
| 4,998,342 | 3/1991 | Bonnell et al. | 29/840 |
| 5,070,604 | 12/1991 | Banba et al. | 29/837 |

FOREIGN PATENT DOCUMENTS

| | | | |
|---|---|---|---|
| 376055 | 7/1990 | European Pat. Off. | 29/840 |
| 2-201997 | 8/1990 | Japan | 29/840 |
| 3-12993 | 1/1991 | Japan | 29/840 |

Primary Examiner—Carl J. Arbes
Attorney, Agent, or Firm—Synnestvedt & Lechner

[57] ABSTRACT

A soldering method is provided which includes applying a solder paste onto a pad for a surface-mount component on a bottom side of a printed circuit board, applying an adhesive to a surface-mount component receiving site on the bottom side of the board, placing a surface-mount component on the bottom side so as to contact the solder paste and adhesive, and reflowing the solder while curing the applied adhesive to affix the surface-mount component to the bottom side of the board. This method also includes disposing a through-hole component on the top side of the board and mass soldering the bottom side of the printed circuit board to join the through-hole component to the board.

20 Claims, 3 Drawing Sheets

REFLOW AND WAVE SOLDERING TECHNIQUES FOR BOTTOM SIDE COMPONENTS

FIELD OF THE INVENTION

This invention relates to the preparation of printed circuit boards, and more particularly, to reflow and wave soldering techniques for reducing solder skips and lost surface-mount components when manufacturing double-sided boards.

BACKGROUND OF THE INVENTION

The manufacture of printed circuit boards ("PCB's") often involves mounting of leaded-through-hole, surface-mount leaded, and leadless electronic components to one or both sides of an insulating substrate. Processing techniques are known to consist of a number of precisely orchestrated steps which can include, adhesive applying, component positioning, and elaborate soldering operations.

Typically, leaded-through-hole components are dropped onto the component side of a printed circuit board and inserted into plated through-holes in the board. The leads of these components are then soldered by exposing the lower surface of the board to a solder wave or dip solder pool which wets both the leads and the conducting surfaces around the leads to secure the leaded-through-hole components to one or more conducting surfaces of the printed circuit board.

In an effort to increase the density of electronic components upon these boards, electronics manufacturers have recently been employing double-sided-mounting techniques in which electronic components are mounted to both sides of a single printed circuit board. With such techniques, both leaded-through-hole and surface-mount components can be soldered to the component side of a printed circuit board with additional surface-mount components being attached to the bottom, or solder side, of the board.

The art has been replete with developments for double-sided-mounting techniques. See Berger, U.S. Pat. No. 4,515,304, (hereinafter "Berger"), Sagawa et al., U.S. Pat. No. 4,814,944, (hereinafter "Sagawa"), Beldavs, U.S. Pat. No. 4,573,105, (hereinafter "Beldavs"), Roback, et al., U.S. Pat. No. 4,851,966, (hereinafter "Roback"), and Bora et al., U.S. Pat. No. 4,761,881, (hereinafter "Bora"), all of which are hereby incorporated by reference as part of this disclosure.

Berger discloses a process for mounting leaded components on one side of a printed circuit board and surface-mount components on the other side of the board using solders having different melting temperatures. This technique employs crimping the lead ends of the leaded-through-hole components prior to flipping over the board and disposing solder paste onto the bottom side by individual applicator nozzles. The paste is applied to the crimped lead ends of the through-hole components and to the surface-mount solder pads on the bottom side of the board. The surface-mount parts are then positioned on the surface-mount pads and the board is reflow soldered. This invention relies on employing a paste solder having a lower melting temperature on the top side of the board for permitting a second reflow soldering operation without losing components on the bottom side. Wave soldering is completely avoided.

Sagawa discloses a lead terminal foot configuration for facilitating the soldering of a surface-mount component to a printed circuit board. This reference teaches the well known technique of provisionally securing the surface-mount component to the printed circuit board with adhesive prior to soldering.

Beldavs discloses a procedure for securing leadless surface-mount components to a printed circuit board which includes bonding the dielectric body of the component to a hole formed in the board with an adhesive plug, hardening the adhesive, and then mass soldering the component to the circuit board.

Roback discloses a method for optimally placing microminiature components on a printed circuit board which includes applying a solder paste to the top side of the board before placing components thereon. These components are then reflow soldered, during which, any misaligned components can be repositioned. Additional components are then attached to the underside of the circuit board. These components are first self-aligned by specially contoured soldering pads, and then affixed in place with adhesive. The underside components and any leaded-through-hole components extending through to the bottom side are then wave soldered to complete the assembly.

Bora discloses a single step reflow soldering process for attaching a variety of component types to both sides of a printed circuit board. The lands of the surface-mount components of the bottom surface are initially screen soldered and then adhesive is dispensed at each component site. The components are placed into the wet solder paste and adhesive, and the adhesive is cured. This curing holds the components to the printed circuit board and permits the solder paste to dry. The board is then flipped to the top side and the surface-mount lands and plated through holes on the top surface are coated with solder paste. The top side components are then placed into the wet solder and the solder is reflowed to complete the assembly.

While such prior art double-sided techniques have generally provided for the mass production of high density component boards, these processes have either been time consuming and expensive, or remiss in eliminating missing bottom side components or solder skips. Moreover, reliance upon large amounts of glue to secure the bottom side components prior to soldering, not only complicates the glue dispensing process, but also increases the likelihood of glue contamination of the solder pads.

SUMMARY OF THE INVENTION

Improved soldering methods are provided by this invention which help to alleviate some of these manufacturing problems. The preferred method of soldering includes screening a solder paste onto a pad for a surface-mount component on a first side of a printed circuit board, applying an adhesive to a surface-mount component receiving site on the first side of the board, placing a surface-mount component on the first side so as to contact the solder paste and adhesive, and reflowing the solder, while simultaneously or independently, curing the applied adhesive to both electrically connect and mechanically affix the surface-mount component to the printed circuit board. This procedure also includes disposing a through-hole component on the second side of the board through at least one hole in the board, followed by mass soldering the first side of the circuit board to join at least the through-hole component to the board.

Accordingly, soldering procedures are provided for producing less costly and higher quality printed circuit boards. By soldering the bottom side surface-mount components to the pads and affixing these components to the board with adhesive, problems associated with losing bottom side components during wave or dip soldering can be substantially eliminated. The presence of a soldered joint between the surface-mount components and the solder pads assures a better soldered joint than that which would be expected by waving soldering alone, and minimizes the need for using a chip, or turbulent, wave for disposing molten solder into the geometric intricacies of the bottom side of the board. The presence of solder in the joint area prior to mass soldering can result in the near elimination of solder "skips", or open electrical contacts caused by insufficient solder or misaligned components on the bottom side of the printed circuit board.

Since the bottom side components can be located easier on a combination of solder paste and glue, then on glue alone, better alignment of components is also possible. Both hand and machine placement can therefore be improved by this invention.

Gluing operations can also be facilitated. Since the bottom side components of this invention are adhered with a strong soldered joint throughout most of the handling steps, a small glue dot of sufficient size to merely insure against failure of the soldered joint during the mass soldering temperatures is all that is necessary. The minimization of glue greatly simplifies the glue dispensing process and reduces the possibility of glue contamination on conductive surfaces, such as solder pads.

BRIEF DESCRIPTION OF THE DRAWINGS

The accompanying drawings illustrate preferred embodiments of this invention so far devised for the practical application of the principles thereof, and in which.

DETAILED DESCRIPTION OF THE INVENTION

Improved printed circuit boards and methods for double surface-mounting components to such boards with fewer solder skips and greater component adherence are provided by this invention.

Figure 1:
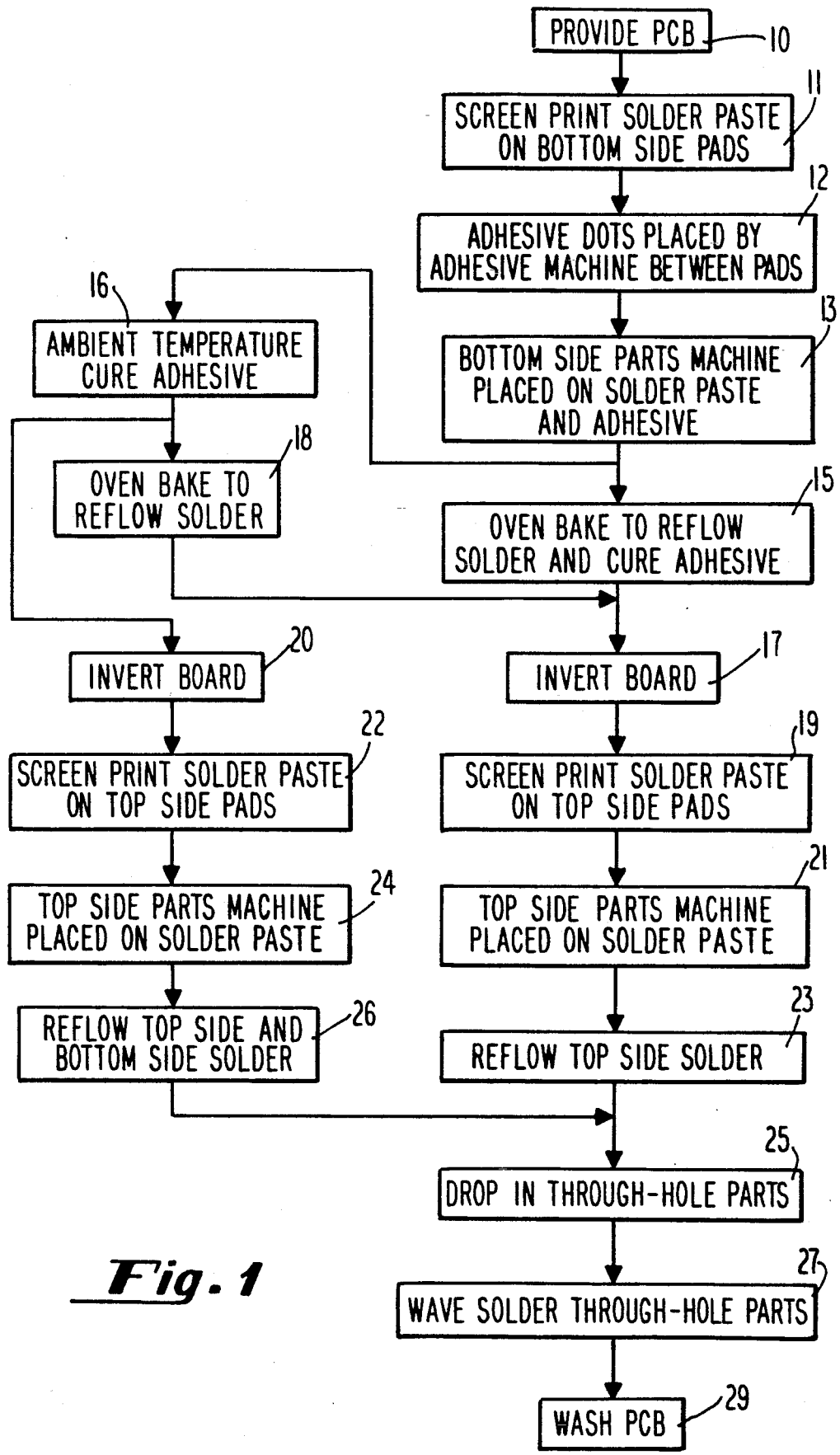
FIG. 1: is a flow chart depicting a plurality of processing sequences for preparing the printed circuit boards of this invention.

With reference to the flow chart of FIG. 1, preferred processing sequences of this invention will now be described. In a first preferred method of soldering provided by this invention, a surface-mount component is adhered to a printed circuit board having a first and a second side. This procedure includes the substantially sequential steps of providing a printed circuit board 10, screening a solder paste on a pad for a surface-mount component on a first, or bottom side of the board 11, applying an adhesive or glue to a surface-mount component receiving site on the first side of the board 12, machine placing a surface-mount component on the first side so as to contact the solder paste and adhesive 13, reflowing the solder and curing the applied adhesive 15, whereby said surface-mount component becomes electrically connected and mechanically affixed to the printed circuit board, inverting the board 17, screening a solder paste on a top side pad 19, machine placing a surface-mount component on the second or top side of the board 21, reflowing the top side solder 23, and disposing a through-hole component on the second side through a hole in the printed circuit board 25. The first or bottom side of the circuit board is then mass soldered, e.g., wave or dip soldered, to join at least the through-hole component to the board 27 and the board is washed 29. As used herein, the term "surface-mount component receiving site" corresponds to an area of the printed circuit board which is substantially covered by the surface-mount component when said component is affixed to the board. It is understood that while simultaneous solder reflowing and adhesive curing steps are suggested by this invention, ambient temperature or UV curing adhesives can equally be employed to permit independent solder reflowing and adhesive curing operations.

In a second preferred method of soldering provided by this invention, the above sequence is rearranged to accommodate air or UV cured adhesives. Following machine placement of the bottom side surface-mount components 13, this alternative procedure permits the ambient temperature adhesive to cure 16, followed by oven baking to reflow the solder on the bottom side 18. The board is then inverted to continue processing according to steps 17–29 as described above. Obviously, with ambient temperature curable adhesives, simultaneous reflowing of the solder and curing of the adhesive is not necessary.

In a variation of the second preferred method of this invention, the ambient-temperature curable adhesive is cured 16 following machine placement step 13. The board is then inverted 20, solder paste is screened onto the top side pads 22, the top side surface-mount parts are machine placed on the solder paste 24, and then the top side and bottom side solder are reflowed 26, before continuing with the above-described steps 25–29. With this alternative embodiment, the ambient temperature curable adhesive is relied upon for securing the bottom side surface-mount components to the board until such time as both the top side and bottom side surface-mount components can be reflow soldered together at step 26.

Figure 2:
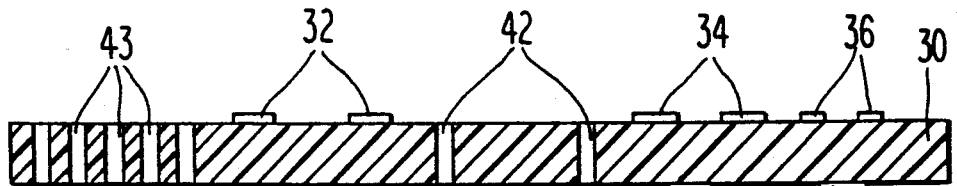
FIG. 2: is a schematic cross-sectional view of a printed circuit board of this invention having solder pads thereon and plated-through-holes.

With reference to FIGS. 2-9, important steps of the soldering operations of the present invention will now be described in detail. FIG. 2 illustrates a schematic cross-sectional representation of a printed circuit board 30 having a pattern of plated through-holes 42, 43 and preferred pre-tinned solder lands or pads, 32, 34, 36, and 38 on its top and bottom surfaces.

Figure 3:
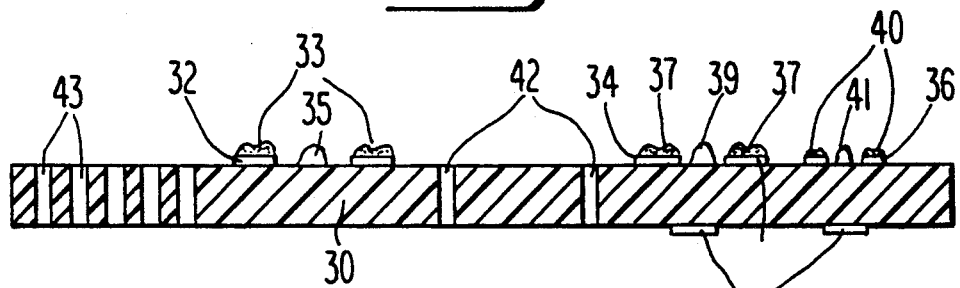
FIG. 3: is the cross-sectional view of the circuit board of FIG. 2 after solder paste has been screened printed onto the solder pads and adhesive has been applied to a surface-mount receiving site.

As illustrated in FIG. 3, solder paste is first applied to the solder pads 32, 34, and 36 on the bottom side in a conventional screen printing operation, wherein solder paste 33, 37, and 40, such as solder loaded flux having 90 wt. % minimum metal components (63 Sn-37 Pb), e.g., Kester R229-25 solder, is silk screened onto the surface-mount pads 32, 34, and 36, respectively. A Fuji GSP-2 Screen Printer is preferably used for this purpose.

Following the application of screen print solder paste, 33, 37, and 40, glue dots 35, 39, and 41 are applied on the printed circuit board with a syringe or injection device. Glue dots can be conveniently placed by an automatic glue dispensing machine, one popular version is Fuji, FGL-2 Dispensing Machine. The glue or adhesive dots 35, 39, and 41 are preferably formed from a hardened adhesive composition. Numerous well-known classes of adhesive can be employed for this purpose, and the use of all such adhesives are within the scope of the present invention. The adhesives are preferably selected so as to bond well with the dielectric material used to encase the electronic components as well as the circuit board. Adhesives which have been found particularly useful include, for example, high temperature resistant adhesives, such as, epoxies and cyano-acrylates. The adhesive compositions preferably generally comprise resin, a catalyst to harden the resin, a filler and/or viscosity control agent. The viscosity control agent preferably ensures that the adhesive will be formable during its application and while simultaneously being sufficiently viscous to remain in place once formed at a given location. The most preferable adhesives are ultra violet or thermal curing adhesives having sufficient elasticity at elevated temperatures, such as Loctite 340, an epoxy-based product.

Figure 4:
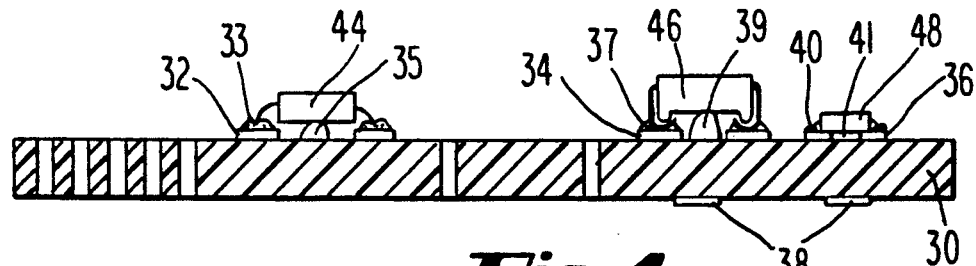
FIG. 4: is the cross-sectional view after several surface-mount components are placed on the solder paste and adhesive.

Following the glue placement step, bottom side surface-mount parts are machine placed onto the solder paste 33, 37, and 40 and glue dots 35, 39, and 41, as illustrated in FIG. 4. These surface-mount components can include, one or more conventional and well known components, such as small outline package 44, J-lead surface-mount component 46, or a leadless component 48 such as are known and conventional. The use of all such components is within the scope of the present invention. A particularly useful placement machine for conducting the placement step is a Fuji CP-2 Placement Machine.

Figure 5:
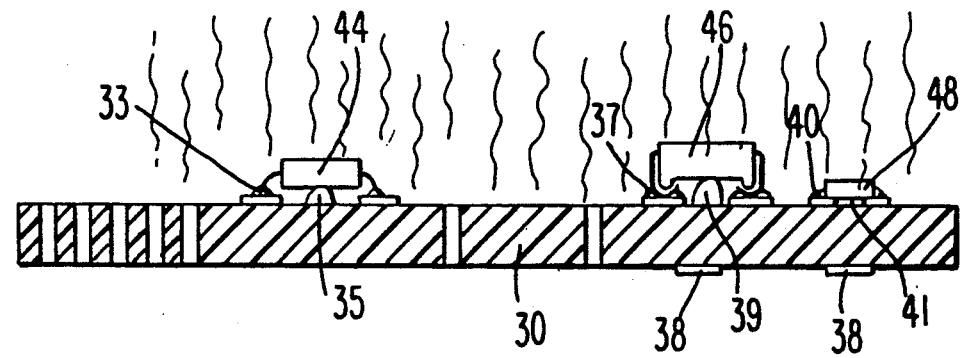
FIG. 5: is the cross-sectional view illustrating a heating operation in which the bottom side solder is reflowed to form a fillet between the leads of the bottom side surface components and their solder pads and the adhesive cures to form a bond between the component body and the board.

Referring to FIG. 5, the bottom side surface-mount components 44, 46, and 48 are then affixed to the printed circuit board 30 by curing the adhesive dots 35, 39, and 41 and by reflow soldering the solder 33, 37, and 40. This can be accomplished, for example, by oven baking the board for about 40-50 seconds, preferably about 45 seconds, at a temperature of about 175°-220° C., preferably about 183° C., to simultaneously reflow the solder paste and cure the preferred epoxy-based glue. A variety of reflow processes are available, such as vapor phase, convection heating, or IR heating. Alternatively, the adhesive dots 35, 39, and 41 can be selected to be UV or air cured prior to, or after, oven baking to reflow the solder, as described earlier.

Figure 6:
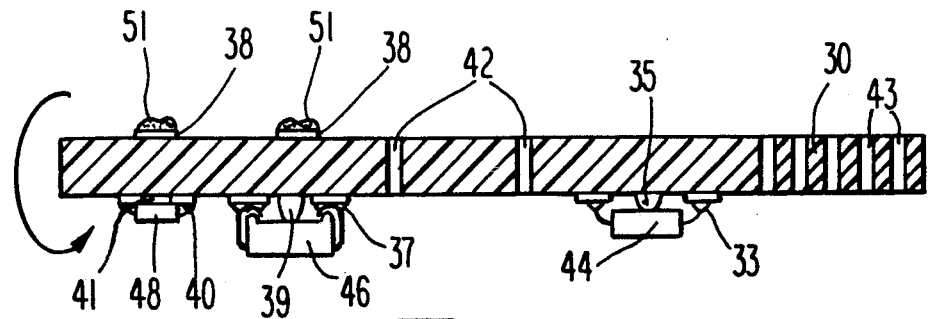
FIG. 6: is the cross-sectional view after the board has been inverted, and solder paste has been applied to the solder pads of a surface-mount component site on the top side of the printed circuit board.
Figure 7:
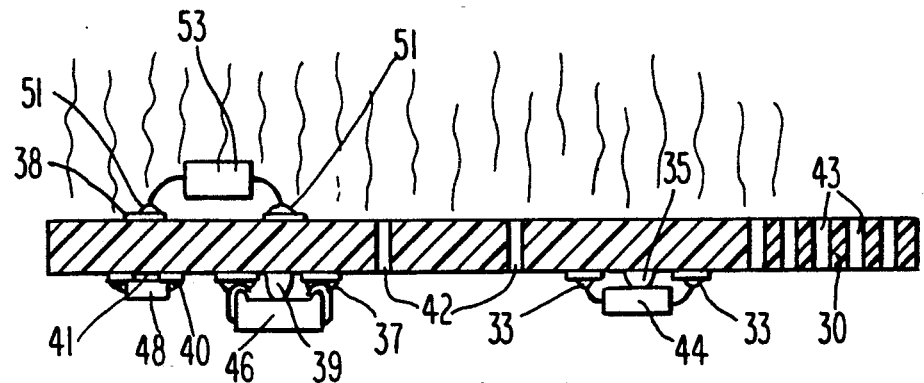
FIG. 7: is the cross-sectional view of FIG. 6, illustrating a heating operation in which the top side solder is reflowed to form a fillet between the leads of the top side surface-mount component and its solder pads.

Referring to FIGS. 6 and 7, the attachment of the top side surface-mount components will now be described. Following attachment of the bottom side components, the printed circuit board 30 is inverted to reveal the preferred pre-tinned bottom-side solder pads 38. Solder paste 51 is screen printed on the bottom side pads similarly to the process described for the top side pads 32, 34, and 36. Since the top side components will not normally be subject to a solder wave or the effects of gravity during subsequent processing, adhesive or glue dots are not necessary. As with the bottom side, the top side surface-mount component 53 is placed, preferably machine placed, into the solder paste 51 and then subjected to a reflow soldering operation whereby the component 53 becomes affixed to the printed circuit board 30. The oven parameters previously described are equally suitable for this operation.

Figure 8:
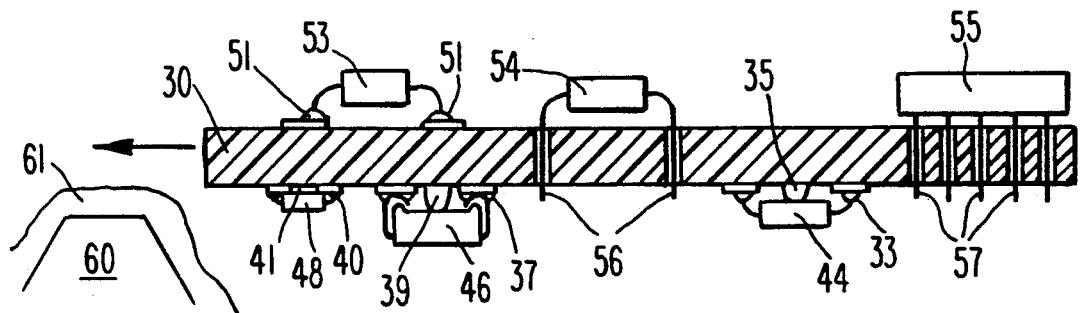
FIG. 8: is the cross-sectional view after top side through-hole components are dropped in the through-holes and the assembly is moved into a wave soldering operation.
Figure 9:
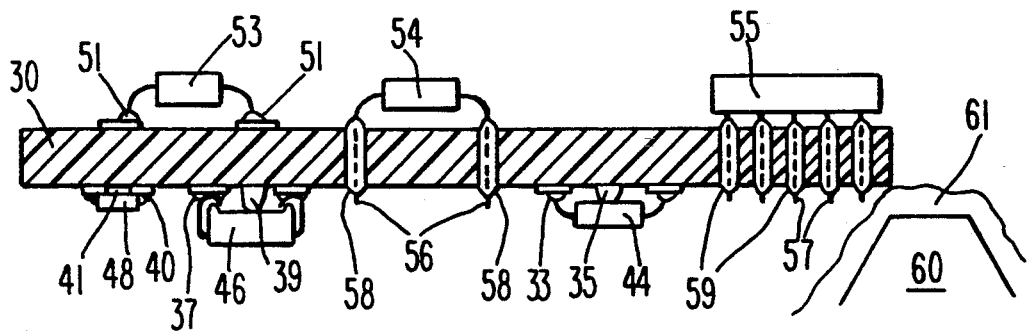
FIG. 9: is the cross-sectional view following wave soldering in which the through-hole parts are soldered to the board by the solder wave.

Referring now to the wave soldering procedure illustrated in FIGS. 8 and 9, there is shown schematically a solder wave 61 created in a molten solder pool by a support plate 60. Preferred wave soldering parameters are as follows:

TABLE I: Wave Solder Parameters

Target Top Board Temperature = 250° F.
Preheater Settings = 23, 25, 39, 17
Conveyor speed = 4 ft./min.
Flux Type = RMA
Solder Pattern = 2 in (LEV-CHECK)
Fluxer Air Pressure = 9 psi (LEV-CHECK)
Dwell Time = 3.00 seconds The through-hole parts 54 and 55, which schematically represent a dual inline package ("DIP") 54 and a pin grid array ("PGA") 55, are preferably hand-dropped into the plated through-holes 42 and 43 of the printed circuit board 30. The printed circuit board 30 is then passed through the solder wave 61 so that the leads 56 and 57 of components 54 and 55 contact the molten solder. Although DIP and PGA configurations are described, it is contemplated that any type of connector having pin leads disposed through the board are suitable and within the scope of the present invention. As illustrated, the entire surface area of the through-hole can be coated with solder fillets 58 and 59, such that the DIP and PGA components are secured to the board. The board is then cleaned, preferably in a Freon bath.

The above-described process was tested in production with COMPAQ Assembly 866 modem boards. Simultaneous heat-curing and reflow soldering were employed during this test to secure the bottom side parts; and hand-dropped, through-hole parts were wave soldered. A subsequent study of these boards revealed a 15% reduction in the bottom side defects attributed to the present methods.

From the foregoing, it can be realized that this invention provides improved printed circuit boards and methods of double-sided-mounting components to a board. The described processes have obtained the advantages of minimizing missing bottom side components, solder skips, and glue contamination on solder pads and other conductive surfaces. This invention has also simplified both the glue dispensing, machine placing, and wave soldering processes. Although various embodiments have been illustrated, this was for the purpose of describing, and not limiting the invention.

Various modifications which will become apparent to one skilled in the art are within the scope of this invention.

What is claimed is:

1. A method of soldering a surface-mount component to a printed circuit board having a first and a second side, comprising the substantially sequential steps of:
   (a) screening a solder paste on a pad for a surface-mount component on said first side of said board;
   (b) applying an adhesive to a surface-mount component receiving site on the first side of the board;
   (c) placing a surface-mount component on said first side so as to contact said solder paste and said adhesive;
   (d) reflowing the solder and curing the applied adhesive, whereby said surface-mount component becomes electrically connected and mechanically affixed to said printed circuit board;
   (e) inverting the board;
   (f) disposing a through-hole component on said second side through a hole in said printed circuit board; and
   (g) mass soldering said first side of said circuit board by contacting said first side with a molten solder pool to join at least said through-hole component to said printed circuit board.

2. The method of claim 1, wherein said screening step (a) comprises silk screening a Sn-Pb solder paste onto a plurality of surface-mount component solder pads.

3. The method of claim 2, wherein said plurality of solder pads are pre-tinned with solder.

4. The method of claim 3, wherein said pre-tinned solder pads are located on both said first and said second sides of said printed circuit board.

5. The method of claim 1, wherein said applying step (b) includes automatically dispensing said adhesive.

6. The method of claim 5, wherein said automatic dispensing step includes applying a heat-curable epoxy-based adhesive.

7. The method of claim 5, wherein said automatic dispensing step includes applying a UV-curable adhesive.

8. The method of claim 1, wherein said placing step (c) comprises machine placing a plurality of surface-mount components on said first side.

9. The method of claim 1, wherein said reflowing and curing step (d) comprises substantially consecutive reflow soldering and adhesive curing operations.

10. The method of claim 1, further comprising after said inverting step (e):
    screening a solder paste on a pad for a second surface-mount component on said second side of said board;
    placing a second surface-mount component on said second side so as to contact said solder paste; and
    reflowing the solder on said second side, whereby said second surface-mount component on said second side becomes soldered to said printed circuit board.

11. A method of soldering a printed circuit board having a top and bottom side, wherein a surface-mount component is adhered to the bottom side of said circuit board by an adhesive and a solder and said bottom side is wave soldered to join a through-hole component to said top side of said printed circuit board, wherein said method further comprises:
    applying a solder paste to a pad for a surface-mount component and a heat-curable adhesive to a surface-mount component receiving site on said bottom side of said circuit board so as to contact said surface-mount component when said surface-mount component is placed; and
    heating said printed circuit board to substantially simultaneously:
    cure said adhesive, and
    reflow said solder, whereby said surface-mount component becomes electrically and mechanically attached to said printed circuit board.

12. A method of claim 11, wherein said applying step includes dispensing a Sn-Pb solder paste to a plurality of pre-tinned solder pads for said surface-mount component and an epoxy-based adhesive to said surface-mount component receiving site on said bottom side of said circuit board.

13. The method of claim 11, further comprising dispensing a solder paste to a pad for a second surface-mount component on said top side of said circuit board and reflowing said solder on said top side, whereby said second surface-mount component becomes soldered to said circuit board.

14. The method of claim 11, wherein a plurality of surface-mount components are reflow soldered to both the top and bottom sides of said circuit board.

15. A method of soldering a leaded-through-hole component and a surface-mount component to oppositely facing top and bottom sides of a printed circuit board respectively, comprising:
    applying a solder paste, an adhesive, and a surface-mount component to a surface-mount receiving site on said bottom side of said printed circuit board;
    curing said adhesive and reflowing said solder to effect adherence of said surface-mount component to said bottom side; inverting said board; inserting said leaded-through-hole component through a plurality of holes in said printed circuit board; and
    wave soldering said leaded-through-hole component to said printed circuit board.

16. The method of claim 15, wherein said solder paste and said adhesive are applied substantially consecutively to a pre-tinned solder pad for a surface-mount component and to said surface-mount receiving site respectively.

17. The method of claim 15, wherein said curing and reflowing steps are provided substantially simultaneously.

18. The method of claim 15, further comprising following said inverting step, screening a solder paste on a pad for a surface-mount component on said top side of said board, applying a second surface-mount component to a surface-mount receiving site so as to contact said solder paste on said top side of said printed circuit board, and reflowing said solder on said top side to effect adherence of said second surface-mount component on said top side to said circuit board.

19. The method of claim 18, wherein said solder application steps comprise silk screening a Sn-Pb solder paste.

20. The method of claim 15, wherein said adhesive curing and solder reflowing steps comprise oven baking said circuit board for about 40–50 seconds at a temperature of about 175°–220° C.

* * * * *